United States Patent [19]
Dempewolf et al.

[11] Patent Number: 5,815,318
[45] Date of Patent: Sep. 29, 1998

[54] AXIALLY-GRADED INDEX-BASED COUPLERS

[75] Inventors: Joseph R. Dempewolf, Taos; Robert K. Wade, Albuquerque, both of N. Mex.

[73] Assignee: LightPath Technologies, Inc., Albuquerque, N. Mex.

[21] Appl. No.: 739,860

[22] Filed: Oct. 31, 1996

[51] Int. Cl.$^6$ ...................................................... G02B 3/00
[52] U.S. Cl. .............................. 359/653; 359/718; 385/33
[58] Field of Search ..................................... 359/653, 434, 359/435, 718–719; 325/33–36, 55, 124

[56] References Cited

U.S. PATENT DOCUMENTS

| | | | |
|---|---|---|---|
| 4,929,065 | 5/1990 | Hagerty et al. | 350/413 |
| 5,323,268 | 6/1994 | Kikuchi | 359/653 |
| 5,541,774 | 7/1996 | Blankenbecler | 359/653 |

OTHER PUBLICATIONS

P.K. Manhart, *Optics and Photonics News*, pp. 44–47, (Mar. 1995).

Xiaojie J. Xu et al, "Preparation of Macro Axial Gradient Refraction Glasses", *Gradient Index Optical Systems—Topical Meeting*, Rochester, NY (Jun. 7–8, 1994).

Primary Examiner—Georgia Y. Epps
Assistant Examiner—Jordan M. Schwartz
Attorney, Agent, or Firm—Benman & Collins

[57] ABSTRACT

An optical coupler is provided that comprises one lens component, comprising at least one axially-graded index of refraction element. When the optical coupler component includes one axially-graded index of refraction element, a homogeneous "boot" element is cemented on entrance surface to provide plano-plano coupling. When the optical coupler includes two or more axially-graded index of refraction elements, both entrance and exit surfaces are planar. The optical coupler component may be sized to provide focusing at its exit surface. The axially graded index-based couplers of the present invention comprise a single component, thereby reducing the number of components and the concomitant complexity of the optical system. Further, many of these couplers can be fabricated with plano-plano entrance-exit surfaces, thereby obviating the need for forming curved focusing surfaces and thus avoiding the introduction of air spaces.

4 Claims, 6 Drawing Sheets

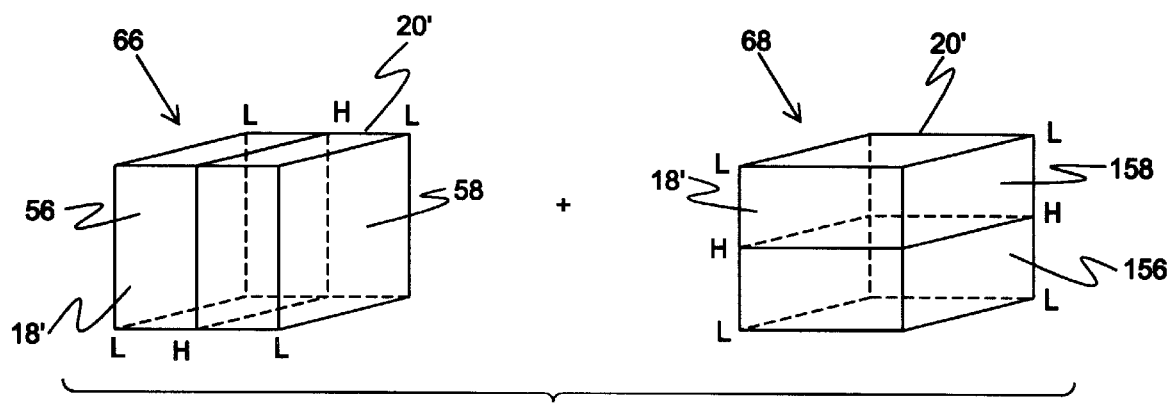
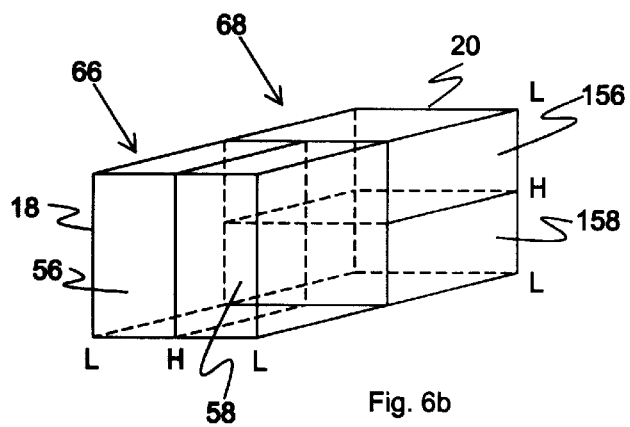

AXIALLY-GRADED INDEX-BASED COUPLERS

TECHNICAL FIELD

The present invention is directed to optical elements, and, more particularly, to couplers for linking one optical device to another and comprising one or more axially-graded index-based elements.

BACKGROUND ART

Couplers are optical elements that join a light source, such as a laser diode, a light-emitting diode, an optical fiber, or other light source, to a light collector, such as a photo detector, an optical fiber, an optoelectronic chip, an optical fiber, and the like.

Prior art couplers comprise either (1) homogeneous glass, or plastic lenses with either spherical, aspherical or cylindrical surfaces, (2) optical fibers and optical fiber based cylindrical lenses, and (3) radially-graded index of refraction glass cylinders or rods. The homogeneous glass, optical fiber based cylindrical, or plastic lenses require air space and have a low numerical aperture or light collection value, which results in less light being delivered to the collector than was incident on the coupling lens. In addition, homogeneous glass or plastic lenses are incapable of correcting for spherical aberration, which results in inefficient coupling, unless an aspheric surface is formed on the lens. Finally, multiple elements are required in order to sufficiently couple the light.

The radially-graded index glass cylinder lenses when functioning with flat surfaces and focusing light at the lens exit surface, overcome one of the problems of homogeneous glass lenses. Further, the radially-graded index glass cylinder lenses comprise a single optical component, thereby overcoming another problem of homogeneous glass lenses. However, these radially-graded index glass cylinder lenses are incapable of correcting spherical aberrations or of forming small focal points, resulting in inefficient coupling performance. While coupling performance may be improved by forming a curved surface on the exit surface of the lens, the advantage of a flat surface is lost, and an air space is introduced into the coupling scheme. Radially graded index cylinder lenses when coupling light through their sides rather than their ends function with an air space requirement and lose the advantage of focusing light to a flat surface. Also, radially graded index lenses with flat surfaces lack sufficient batch to batch manufacturing reproducibility such that lenses performance varies so significantly that their effective focal length often varies too much to satisfy the strict manufacturing tolerance specifications necessary for many devices to be efficiently mass produced without coupling airspace. Additionally, radially graded index coupling lenses with curved surfaces have the disadvantage of requiring a varying degree of surface curvature in order to minimize the inherent spherical aberration introduced by the less than ideal profile of index change in these lenses that is limited by their manufacturing process requirements. Finally, radially graded index of refraction coupling lenses are limited in the amount of index change that can be placed into these lenses, which is several times less than what can be placed into the axially graded index lenses that are central to the invention to be described hereunder.

What is needed is an optical coupler that comprises a single component and efficiently gathers and focuses light.

DISCLOSURE OF INVENTION

In accordance with the present invention, an optical coupler is provided that comprises a single lens component, comprising at least one axially-graded index of refraction element. When the optical coupler component includes one axially-graded index of refraction element, a homogeneous "boot" element is cemented on entrance surface to provide plano-plano coupling. When the optical coupler includes two or more axially-graded index of refraction elements, both entrance and exit surfaces are planar. The optical coupler component may be sized to provide focusing at its exit surface.

The axially graded index-based couplers of the present invention comprise a single component, thereby reducing the number of components and the concomitant complexity of the optical system. Further, many of these couplers can be fabricated with plano-plano entrance-exit surfaces, thereby obviating the need for forming costly curved focusing surfaces and thus avoiding the introduction of air spaces which cause increased alignment sensitivity and consequently add steps to the assembly of components that have light coupling requirements.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

FIG. 1b is a side elevational view of the prior art coupler shown in FIG. 1a;

FIG. 5b is a top plan view of the quadaxially-graded coupler component shown in FIG. 5a;

FIG. 6a is a perspective view depicting the orientation of two biaxially-graded coupler components, prior to joining together to form the quadaxially-graded coupler component; and FIG. 6b is a perspective view of the quadaxially-graded coupler component following joining together of the two biaxially-graded coupler components shown in FIG. 6a.

BEST MODES FOR CARRYING OUT THE INVENTION

Reference is now made in detail to certain specific embodiments of the present invention, which illustrates the best modes presently contemplated by the inventor for practicing the invention. Alternative embodiments are also briefly described as applicable.

A. Axial Gradient Index of Refraction Lenses

Axial gradient index of refraction lenses, sometimes referred to in the prior art as GRIN lenses, are flat glass slabs with a predesigned refractive index perturbation within it which provides the functionality of analog lens array; see, e.g., P. K. Manhart, *Optics and Photonics News*, pp. 44–47, (March 1995). The unique axial gradient lens fabrication technology available from LightPath Technologies, Inc. (Albuquerque, N. Mex.) has begun to revolutionize the imaging industry. The lenses are available under the trademark GRADIUM.

The fabrication of axial GRIN lens blanks has been described elsewhere; see, e.g., U.S. Pat. No. 4,929,065 and Xiaojie J. Xu et al, "Preparation of Macro Axial Gradient Refraction Glasses", *Gradient Index Optical Systems—Topical Meeting*, Rochester, N.Y. (Jun. 7–8, 1994), which disclose stacking a plurality of glass plates, each of a different composition, to form a stack, which is then fused at a sufficiently high temperature to cause interdiffusion of elements of the composition, thereby forming a unitary glass body. The particular profile of index of refraction, whether linear, parabolic, quadratic, cubic, etc., is achieved by control of the thicknesses and index of refractions (compositions) of the individual glass plates. Thus, a desired profile may be fabricated from a calculation of plate thickness and index of refraction, as taught in that patent.

In another approach, glass frits may be used to form the lens blank. In this case, the desired profile may be fabricated, based on the weight of frit having a particular index of refraction (composition). Knowing the density of a particular glass composition permits conversion of plate thickness to weight. This approach is the subject of a patent application Ser. No. 08/441,275, filed May 15, 1995, and assigned to the same assignee as the present application.

The unitary glass body, or boule, that is formed by heating the glass plates or glass frits to a sufficiently high temperature for a period of time is then core-drilled to provide a plurality of glass blanks, which are then ground and polished to provide lenses. A variety of lens surfaces may be formed, including plano, concave, and convex, and combinations thereof.

B. Optical Couplers/Collimators

Figure 3:
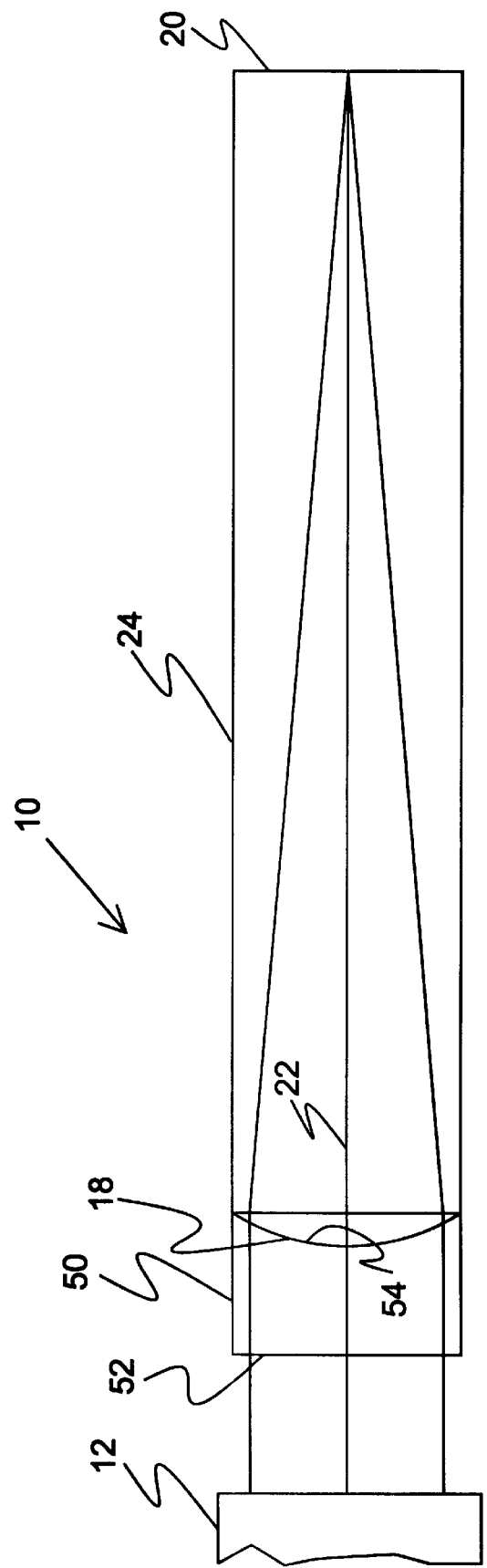
FIG. 3 is a side elevational view of an axially-graded coupler component of the present invention.

The optical coupler/collinator 10 of the present invention is used for coupling light from a light source 12 to a light collector 14, as shown in FIG. 3. The optical coupler/collimator 10 comprises a single component having a light entrance surface 18 and a light exit surface 20 and an optical axis 22 therebetween. The single component includes at least one axially graded index of refraction element 24.

Figure 1A:
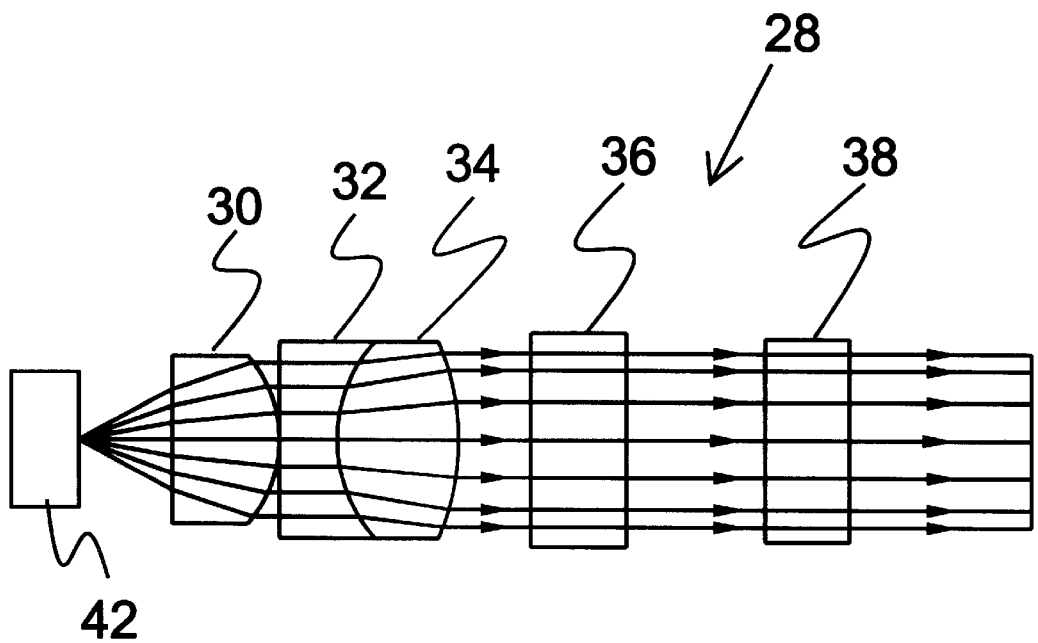
FIG. 1a is a top plan view of a prior art coupler comprising a plurality of homogeneous glass components.
Figure 1B:
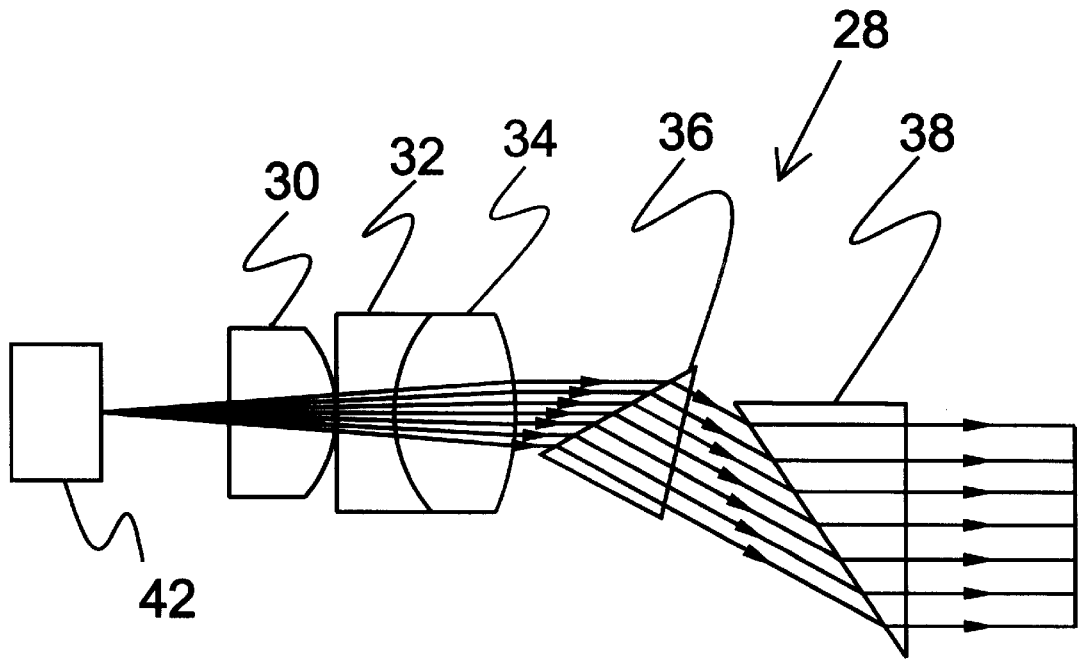

For comparison, a prior art optical collimator 28 comprising a plurality of homogeneous optical elements 30, 32, 34, 36, and 38 is required to collimate and circularize a beam 40 from a laser diode 42. The side and top views of the prior art optical collimator 28 are depicted in FIGS. 1a and 1b, respectively. It will be immediately apparent that many optical components are required to collimate and circularize the beam 40.

Figure 2A:
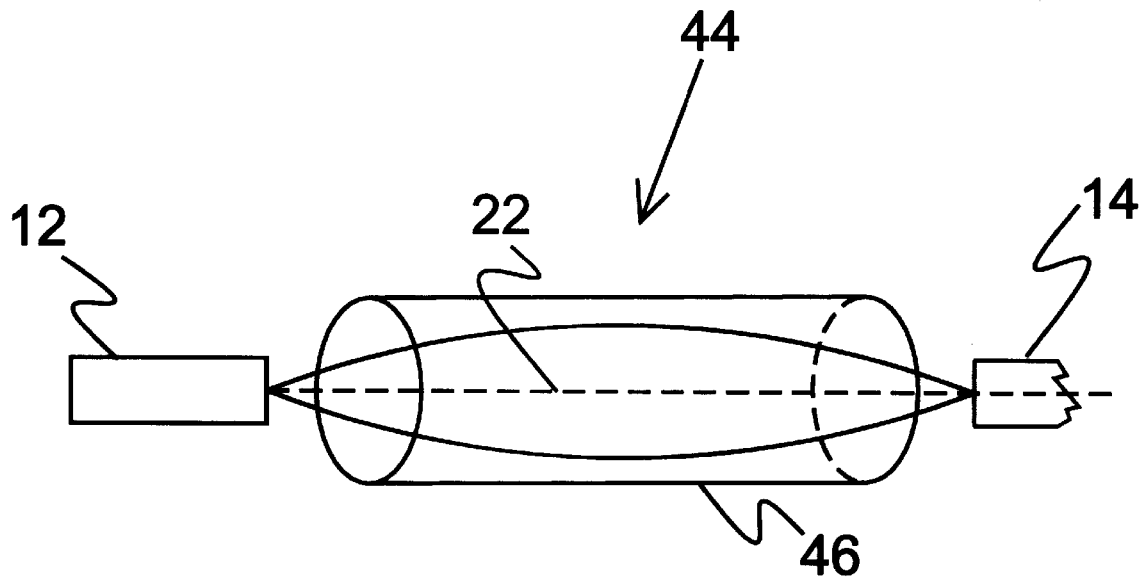
FIG. 2a is a perspective view of a prior art coupler comprising a radially-graded glass component.
Figure 2B:
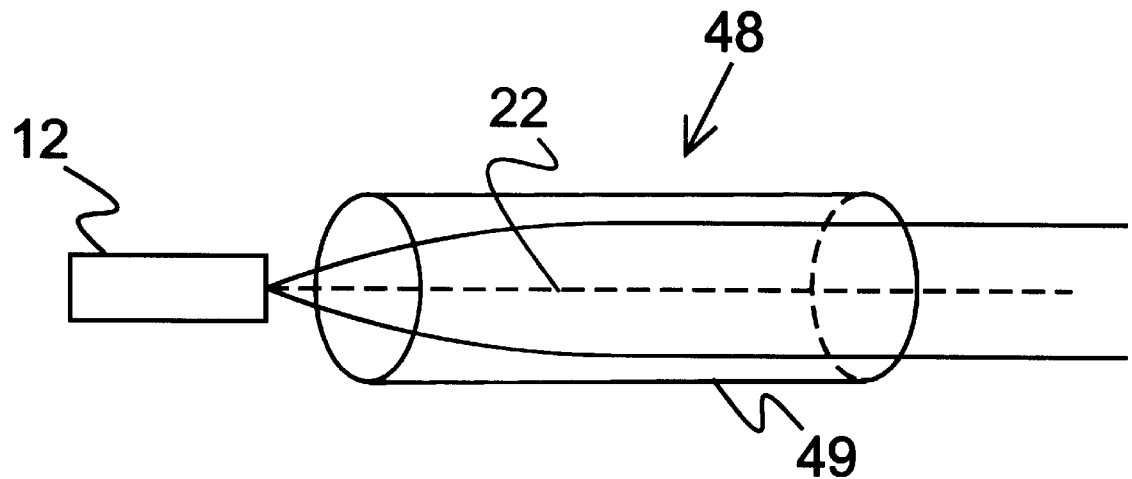
FIG. 2b is a perspective view of a prior art collimating/focusing element comprising a radially-graded glass component.

Also for comparison, a prior art optical coupler 44 comprises a single radially-graded optical element 46 for coupling light from the light source 12, such as a laser diode or an optical fiber, to the light detector 14, such as a fiber diode or a photodetector, along the optical axis 22, as shown in FIG. 2a. Alternatively, a prior art optical collimator 48 comprises a single radially graded optical element 49 and collimates light from the light source 12, again, such as a laser diode or optical fiber, as shown in FIG. 2b.

1. Axially-Graded Optical Coupler/Collimator

Referring again to FIG. 3, the axially-graded optical coupler/collimator 10 is a single component and comprises a mono-axially graded index of refraction element 24 having a convex, spherical entrance 18, a plano exit surface 20, and the optical axis therebetween 22. A homogeneous glass blank with a sufficiently different index of refraction than that of the entrance 18 of the axially graded index element 50 has a plano entrance surface 52 and a concave, spherical surface 54 matched to the convex, spherical surface 18. By "sufficiently different" is meant that the difference in index of refraction is at least about 0.2. While a smaller difference may be employed in the practice of the present invention, a higher radius curved surface 18 would be required.

The spherical surfaces 18, 54 are joined together, such as with a suitable optical cement. The component 10 has a length from its entrance surface 18 to its exit surface 20 such that light incident on the entrance surface is focused to a point on the exit surface to perform as a focusing coupler and by decreasing the radius of curvature of the convex surface 18 of the axially graded index of refraction element a collimating lens is embodied.

The resulting axially graded coupler/collimator lens has significant advantages over a homogeneous lens with spherically or aspherically curved surface(s) that are readily apparent to those skilled in the art of lens design and fabrication.

2. Biaxially-Graded Optical Coupler/Collimator

Figure 4A:
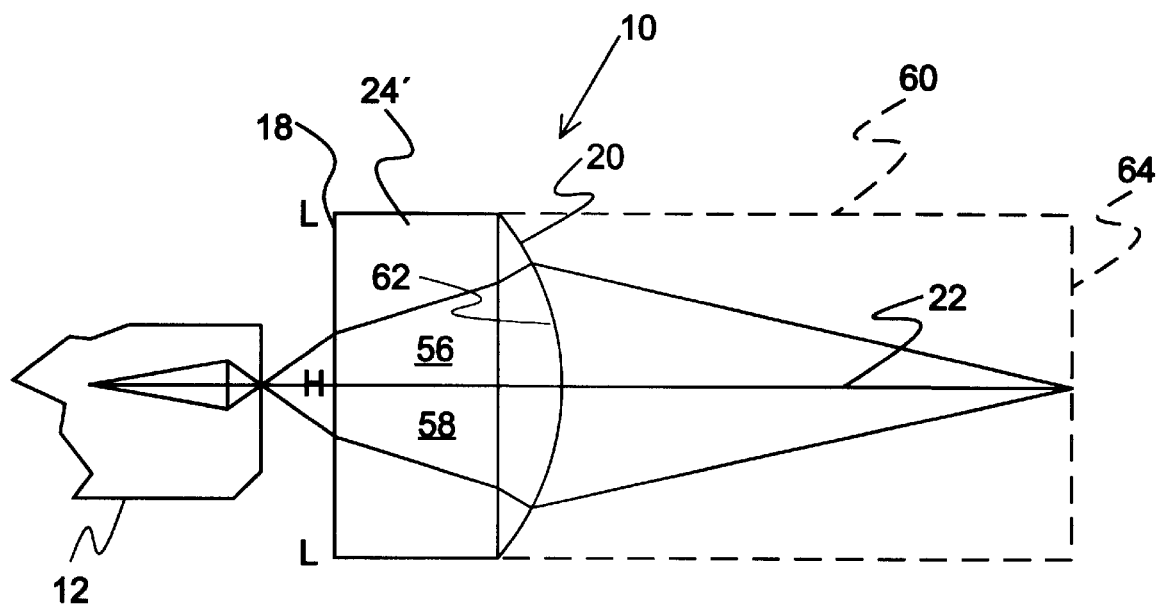
FIG. 4a is a side elevational view of a biaxially-graded coupler component of the present invention.

The biaxially-graded optical coupler 10 is a single component comprising a biaxially graded index of refraction element 24' having a plano entrance surface 18 and either a convex, spherical, aspherical or cylindrical exit surface 20 and the optical axis 22 therebetween, as depicted in FIG. 4a. The biaxially graded index of refraction element 24' comprises two axially graded index of refraction sub-elements 56, 58. Each sub-element 56, 58 has a gradient in index of refraction that begins at a lower value (L) on one surface and ends at a higher value (H) on an opposite surface, with both the sub-elements joined together at the surfaces having the higher value of index of refraction. The joined surfaces (H) are perpendicular to the entrance and exit surfaces 18, 20.

The biaxial optical coupler 10 may further include a homogeneous glass blank 60, shown in phantom, having a concave, spherical, aspherical, cylindrical, or diffractive entrance surface 62 matched respectively to the convex, spherical, aspherical, cylindrical, or diffractive surface 20 of the biaxially-graded index of refraction element, with the respective spherical, aspherical or cylindrical surfaces joined together, and a plano exit surface 64. In this case, the coupler 10 has a length from its entrance surface 18 to its exit surface 64 such that light incident on the entrance surface is focused to a point on the exit surface 64.

Figure 4B:
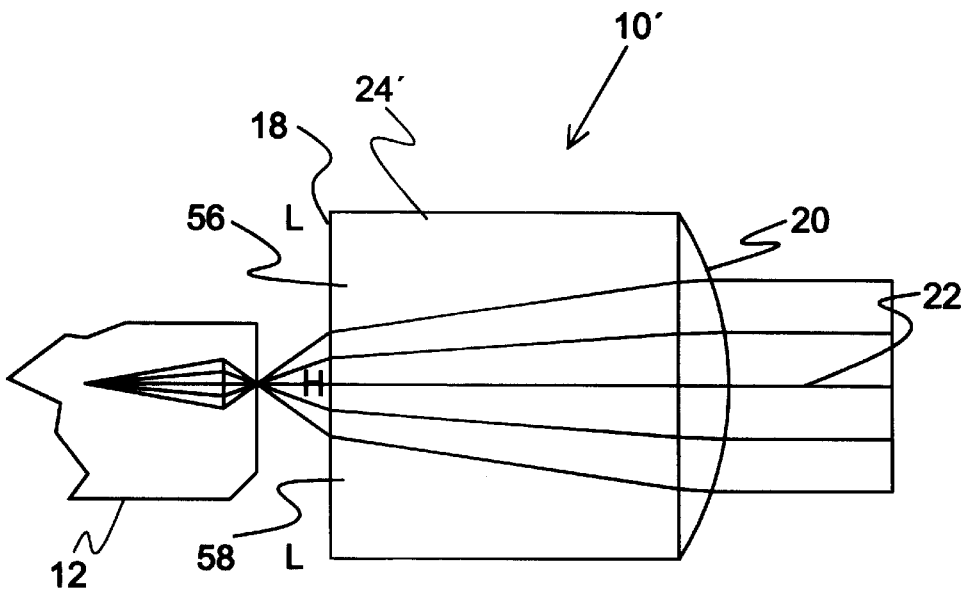
FIG. 4b is a side elevational view of a biaxially-graded collimator component of the present invention.

A biaxial optical collimator 10' is depicted in FIG. 4b, and comprises the biaxially-graded element 24' described above. In this case, the element 24' has a smaller radius of curvature than that of the element 24' depicted in FIG. 4a.

3. Quadaxially-Graded Optical Coupler

Turning now to FIGS. 5a–5d and 6a–6b, the quadaxially-graded optical coupler 10 is a single component 24 comprising a quadaxially graded index of refraction element having a plano entrance surface 18 and a plano exit surface 20 and the optical axis therebetween 22. The quadaxially-graded index of refraction element comprises two biaxially-graded index of refraction sub-elements 66, 68. Each sub-element 66, 68 comprises two axially-graded index of refraction sub-sub-elements 56, 58 and 156, 158, respectively, having a gradient in index of refraction that beginning at a lower value (L) on one surface and ending at a higher value (H) on an opposite surface. The two sub-sub-elements 56, 58 and 156, 158 are joined together at the surfaces having the higher value of index of refraction, the joined surfaces being perpendicular to the entrance and exit surfaces 18, 20. The two biaxially graded index of refraction sub-elements 66, 68 are joined together along the exit surface 20' of one sub-element 66 to the entrance surface 18' of another sub-element 68, with one sub-element rotated 90° about the optical axis with respect to the other sub-element. The details of joining the two sub-elements 66, 68 are shown in FIGS. 6a (before joining). and 6b (after joining).

Figure 5A:
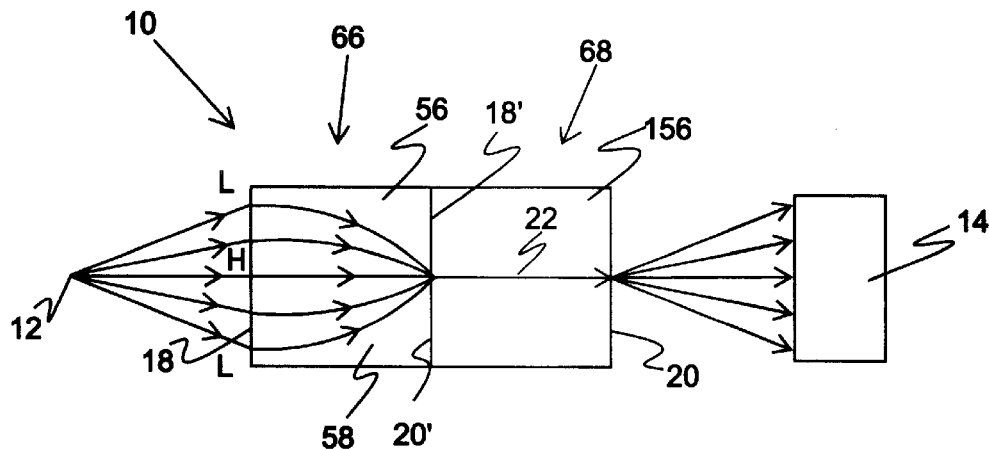
FIG. 5a is a side elevational view of a quadaxially-graded coupler component of the present invention, comprising two biaxially-graded components rotated 90 degrees with respect to each other and cemented end-to-end.
Figure 5B:
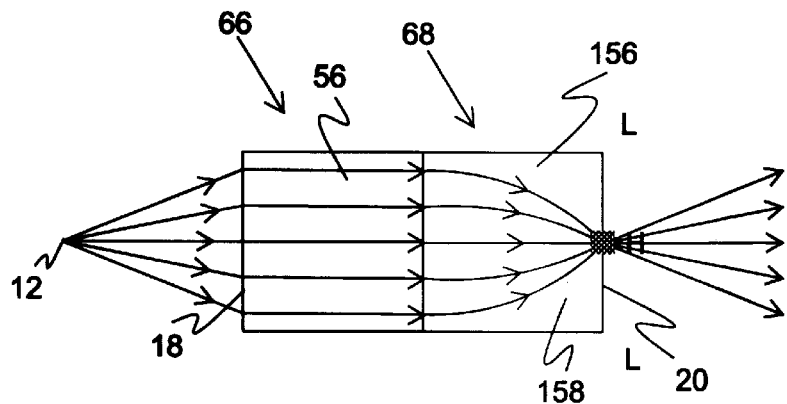
Figure 5D:
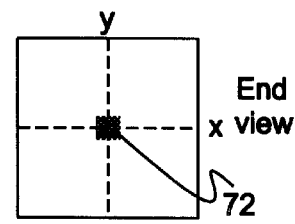
FIG. 5d is an end view of the quadaxially-graded coupler component shown in FIGS. 5a and 5b, depicting the resulting square focus spot.
Figure 5C:
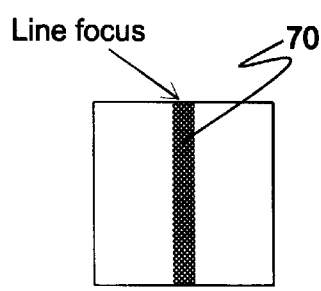
FIG. 5c is an end view of the first of the biaxially-graded components shown in FIGS. 5a and 5b, depicting the resulting line focus spot.

Light passing through the first sub-element 66 is focused to a line 70 having a finite width, as shown in FIG. 5c. After passing through the second sub-element 68, the light is focused to a square 72, having a side length that is equal to the width of the line 70, as shown in FIG. 5d. Consequently, the output from the light source 12 is made symmetrical about the x and y axes.

The quadaxial lens may be compared to the radially graded index of refraction lens depicted in FIG. 2, which suffers from size, Δn, profile control, circular focal spot, and Gaussian light intensity distribution limitations.

In any of the foregoing lenses of the present invention, it appears that the preferred profile is a parabolic profile. The parabolic profile is preferred for replicating a concave curved entrance surface. The Δn employed may be any reasonable value, with the caveat that a smaller Δn only requires a larger overall lens size.

A very important set of additional features includes the placement of diffractive optical surfaces onto the surfaces of and or between the axially graded index of refraction elements to provide additional degrees of freedom to correct for chromatic aberration along the optical axis of the above described lens configurations and/or to provide for focusing and/or collimation of light through the above lenses in an additional dimension. Such a lens could be formed by placing the diffractive element onto a given surface in the substance of an epoxy material that is then cemented to the other axially graded index of refraction element of a biaxially graded index of refraction element with an optical cement that has an index of refraction significantly different from that of the epoxy material.

This permits the coupling of tunable lasers without changes in optical path difference (OPD) and provides the ability to focus light simultaneously in from two light sources in two or more directions: (a) through the optical axis; (b) at a 90° degree angle from the optical axis; and (c) at a 45° angle to the optical axis as enabled by the employment of the aforementioned diffractive and/or holographic optical elements.

Additionally, active materials whose refractive indices can be modulated to provide optically transparent signal or focal point switching functions may be added to the lenses disclosed above.

INDUSTRIAL APPLICABILITY

The axially-graded index-based couplers and collimators of the invention are expected to find use in a variety of applications, particularly in conjunction with laser diode light sources, light emitting diodes, optoelectronic devices, and integrated optics applications obvious to those skilled in this art in which the absence of curved surfaces and airspaces and in which the aforementioned features of the present invention can be applied to better control the behavior.

Thus, there has been disclosed an axially-graded index-based coupler/collimator. It will be readily apparent to those skilled in this art that various changes and modifications of an obvious nature may be made, and all such changes and modifications are considered to fall within the scope of the present invention, as defined by the appended claims.

What is claimed is:

1. An optical coupler for coupling light from a light source to a light collector, said optical coupler comprising a single component having a plano light entrance surface and a plano light exit surface and an optical axis therebetween, said single component including at least one axially graded index of refraction element, wherein said single component comprises a mono-axially graded index of refraction element having a convex, spherical entrance surface and a plano exit surface and said optical axis therebetween, with a homogeneous glass blank having a plano entrance surface and a concave, spherical surface matched to said convex, spherical surface, said spherical surfaces joined together, said component having a length from its entrance surface to its exit surface such that light incident on said entrance surface is focused to a point on said exit surface.

2. An optical coupler for coupling light from a light source to a light collector, said optical coupler comprising a single component having a plano light entrance surface and a plano light exit surface and an optical axis therebetween, said single component including at least one axially graded index of refraction element, wherein said single component comprises a biaxially graded index of refraction element having a plano entrance surface and a spherical, aspherical, or cylindrical exit surface and said optical axis therebetween, said biaxially graded index of refraction element comprising two axially graded index of refraction sub-elements, each said sub-element having a gradient in index of refraction that begins at a lower value on one surface and ends at a higher value on an opposite surface, with both said sub-elements joined together at said surfaces having said higher value of index of refraction, said joined surfaces perpendicular to said component entrance and exit surfaces.

3. The optical coupler of claim 2 further including a homogeneous glass blank secured to said biaxially-graded index of refraction element, said element having a convex, spherical, aspherical or a cylindrical exit surface and said homogeneous glass blank having (a) a concave, spherical, aspherical or a cylindrical entrance surface matched to said convex, spherical, aspherical or cylindrical exit surface of said element, said respective spherical, aspherical or cylindrical surfaces joined together, and (b) a plano exit surface, said component having a length from its entrance surface to its exit surface such that light incident on said entrance surface is focused to a point on said exit surface.

4. An optical coupler for coupling light from a light source to a light collector, said optical coupler comprising a single component having a plano light entrance surface and a plano light exit surface and an optical axis therebetween, said single component including at least one axially graded index of refraction element, wherein said single component comprises a quadaxially graded index of refraction element having a plano entrance surface and a plano exit surface and said optical axis therebetween, said quadaxially graded index of refraction element comprising two biaxially graded index of refraction sub-elements, each said sub-element comprising two sub-sub-elements, each sub-sub-element having a gradient in index of refraction that begins at a lower value on one surface and ends at a higher value on an opposite surface, with both said sub-sub-elements joined together at said surfaces having said higher value of index of refraction, said joined surfaces perpendicular to said component entrance and exit surfaces, said two biaxially graded index of refraction sub-elements joined together along an exit surface of one sub-element to an entrance surface of another sub-element, one sub-element rotated 90° about said optical axis with respect to the other said sub-element.

* * * * *